US008489351B2

(12) United States Patent  
Carter et al.

(10) Patent No.: US 8,489,351 B2
(45) Date of Patent: Jul. 16, 2013

(54) SYSTEM AND METHOD FOR FREQUENCY MEASUREMENT BASED ON QUADRATIC FORMS

(75) Inventors: Ronald W. Carter, Russellville, AR (US); Kurt H. Copley, Smyrna, TN (US)

(73) Assignee: Schneider Electric USA, Inc., Palatine, IL (US)

( * ) Notice: Subject to any disclaimer, the term of this patent is extended or adjusted under 35 U.S.C. 154(b) by 198 days.

(21) Appl. No.: 12/895,030

(22) Filed: Sep. 30, 2010

(65) Prior Publication Data

US 2012/0084035 A1    Apr. 5, 2012

(51) Int. Cl.
*G01R 23/00* (2006.01)
(52) U.S. Cl.
USPC .......................................................... 702/75
(58) Field of Classification Search
USPC .......................................................... 702/75
See application file for complete search history.

(56) References Cited

U.S. PATENT DOCUMENTS

| 6,519,537 | B1 | 2/2003 | Yang ................................. 702/58 |
| 7,184,937 | B1 | 2/2007 | Su et al. ......................... 702/189 |
| 2004/0243329 | A1 | 12/2004 | Seki ................................. 702/75 |
| 2006/0215064 | A1* | 9/2006 | Dawson et al. ................ 348/730 |
| 2006/0235631 | A1 | 10/2006 | Carter .............................. 702/61 |

OTHER PUBLICATIONS

Hocaoglu et al., Using Bilinear and Quadratic Forms for Frequency Estimation, 1996.*
A. Koksal Hocaoglu & Michael J. Devaney, A New Quadratic Form Based Frequency Measurement Algorithm, IEEE Instrumentation and Measurement Technology Conference, Jun. 4-6, 1996, pp. 1065-1070, Brussels, Belgium.
Hocaoglu, A. et al. "A New Quadratic Form Based Frequency Measurement Algorithm." IEEE Instrumentation and Measurement Technology Conference. Jun. 1996 (p. 1065-1070).
Kamwa, I. et al. "Fast Adaptive Schemes for Tracking Voltage Phasor and Local Frequency in Power Transmission and Distribution System." IEEE: Proceedings of the Power Engineering Society Transmission and Distribution Conference. Sep. 1991 (p. 930-936).
Kezunovic, M. et al. "New digital Signal Processing Algorithms for Frequency Deviation Measurement." IEEE Transactions on Power Delivery. vol. 7, No. 3, Jul. 1992 (p. 1563-1573).

(Continued)

*Primary Examiner* — Stephen Cherry
(74) *Attorney, Agent, or Firm* — Nixon Peabody LLP

(57) ABSTRACT

A system and methods for determining points for an algorithm to calculate the frequency of a waveform measured from a monitoring device. Data points are measured from the waveform. A last point of interest from the previous cycle of the waveform is referenced. Four points of interest at equally spaced phase angles from the current cycle of the waveform are determined by calculating the average of the data points around each of the respective equally spaced phase angles of the current cycle of the waveform. The average value of the points of interest in the current cycle is subtracted from the four points of interest and the last point of interest from the previous cycle to compensate for DC bias. A frequency of the waveform is determined based on the determined four points of interest of the current cycle and the last point of interest from the previous cycle. The correction factor for determining sample frequency may be reduced for subsequent cycles in order to increase stability.

13 Claims, 2 Drawing Sheets

OTHER PUBLICATIONS

Perunicic, B. "New Digital Signal Processing Approach to the Design of the Algorithms for Frequency Deviation Measurement." IEEE: Proceedings of the Annual Conference of the Industrial Electronics Society. Nov. 1990 (p. 17-22).

International Search Report mailed Jan. 23, 2012 which issued in corresponding International Patent Application No. PCT/US2011/053864 (7 pages).

Written Opinion mailed Jan. 23, 2012 which issued in corresponding International Patent Application No. PCT/US2011/053864 (9 pages).

* cited by examiner

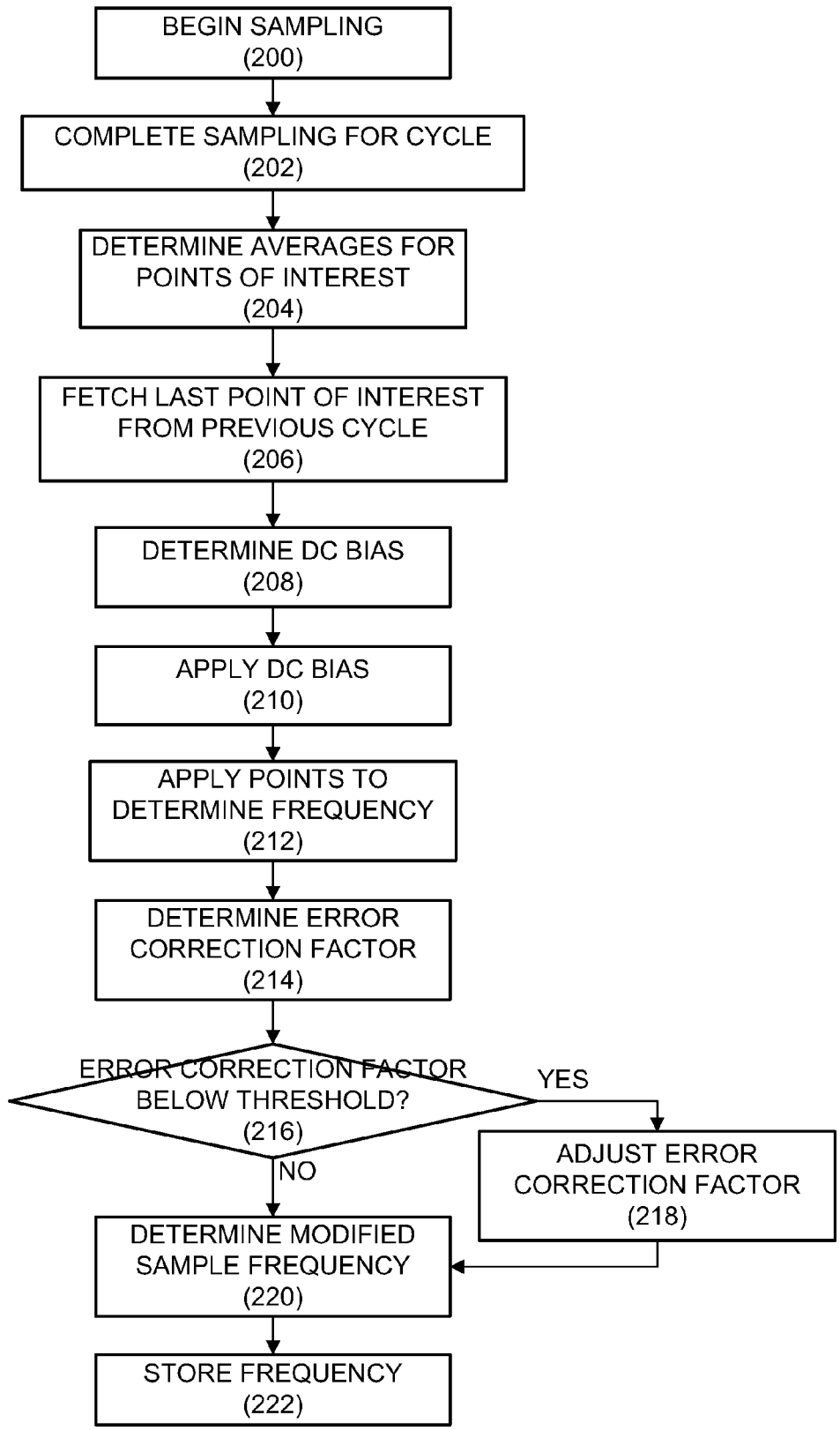

SYSTEM AND METHOD FOR FREQUENCY MEASUREMENT BASED ON QUADRATIC FORMS

FIELD OF THE INVENTION

Aspects disclosed herein relate generally to power monitoring systems, and, in particular, to a system to more efficiently determine voltage or current signal frequencies.

BACKGROUND

Microprocessor-based electrical power systems accumulate considerable amounts of information concerning the electrical distribution systems to which they are connected, as well as the power equipment itself. Today's utility monitoring systems provide end-users with the capability to remotely monitor a variety of equipment via automatic monitoring devices. The spectral information is used when compensating a system to reduce harmonic content and for other troubleshooting purposes.

The typical monitoring device such as a digital power meter utilizes an analog-to-digital (A/D) converter and a microprocessor, and thus all analysis is done in the discrete time or digital domain. In order to minimize error in measurements such as power, THD, etc., it is necessary to obtain voltage and current data over an integral number of cycles. Since the system frequency varies over time, it is necessary to vary the sample rate to maintain the sampling over an integral number of cycles. The input signals (such as current or voltage) are digitized by the A/D converter operating at a sampling rate which is controlled by a digital clock which may operate at a fixed or variable frequency. If it operates at a fixed frequency, it is necessary to re-sample the data in firmware to maintain the integral number of cycles in the measurement data. Regardless of which method is used, an accurate measurement of the system frequency is required. The changing of the frequency of a measured signal necessitates constant monitoring to insure accurate measurements are taken of the signal being monitored.

One known method of determining frequency is by using an algorithm that takes samples from four points in a waveform cycle and a fifth point from the previous cycle. This algorithm (the "Devaney" algorithm) is explained in "A New Quadratic Form Based Frequency Measurement Algorithm" IEEE Instrumentation and Measurement Technology Conference, Jun. 4-6, 1996. The Devaney algorithm determines the frequency of a measured signal using quadratic forms of sampled signals and does not require a fixed sampling frequency. The algorithm requires a limited number of samples and is relatively insensitive to harmonic distortion. The Devaney algorithm requires constant monitoring of each cycle sampled in order to determine frequency based on a limited number of sample points.

Thus, it would be useful to have an accurate sampling protocol that provides determination of a frequency of a waveform with stable frequency measurements.

BRIEF SUMMARY

According to one example, a method of calculating a frequency of a waveform measured from a monitoring device is disclosed. Data points from the waveform are measured. A last point of interest is referenced from the previous cycle of the waveform. Four points of interest at equally spaced phase angles from the current cycle of the waveform are determined by calculating the average of the data points around each of the respective equally spaced phase angles of the current cycle of the waveform. A frequency of the waveform is determined based on the determined four points of interest of the current cycle and the last point of interest from the previous cycle.

Another example is a monitoring device for measuring the frequency of a waveform. The monitoring device includes an input coupled to the waveform. An analog to digital converter is coupled to the input. The analog to digital converter measures a plurality of data points from the waveform. A memory stores a point of interest from a previous cycle of the waveform. A controller is coupled to the analog to digital converter. The controller references a point of interest from the previous cycle. The controller determines four points of interest at equally spaced phase angles from the current cycle of the waveform are determined by calculating the average of the data points around each of the respective equally spaced phase angles of the current cycle of the waveform. A frequency of the waveform is determined based on the determined four points of interest of the current cycle and the last point of interest from the previous cycle.

Another example is a machine readable medium having stored thereon instructions for determining the frequency of a waveform. The stored instructions include machine executable code, which when executed by at least one machine processor, causes the machine to measure data points from the waveform. The instructions cause the machine to reference a last point of interest from the previous cycle of the waveform. The instructions cause the machine to determine four points of interest at equally spaced phase angles from the current cycle of the waveform are determined by calculating the average of the data points around each of the respective equally spaced phase angles of the current cycle of the waveform. The instructions cause the machine to determine a frequency of the waveform based on the determined four points of interest of the current cycle and the last point of interest from the previous cycle.

Another example is a method of calculating a frequency of a waveform measured from a monitoring device. Data points are measured from the waveform. A last point of interest from the previous cycle of the waveform is referenced. Four points of interest at equally spaced phase angles from the current cycle of the waveform are determined by calculating the average of the data points around each of the respective equally spaced phase angles of the current cycle of the waveform. The average value of the points of interest in the current cycle are subtracted from the four points of interest and the last point of interest from the previous cycle to compensate for DC bias. A frequency of the waveform is determined based on the determined four points of interest of the current cycle and the last point of interest from the previous cycle. A sample frequency is determined for the next cycle by multiplying the previous frequency by one plus a correction factor. The correction factor is the difference between the frequency of the current cycle and the previous cycle. The correction factor is compared to a threshold value, and the correction factor for the next cycle is reduced if the correction factor is below the threshold value.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 2 is a flow diagram of an exemplary algorithm for efficiently determining the points for a Devaney algorithm.

Figure 1:
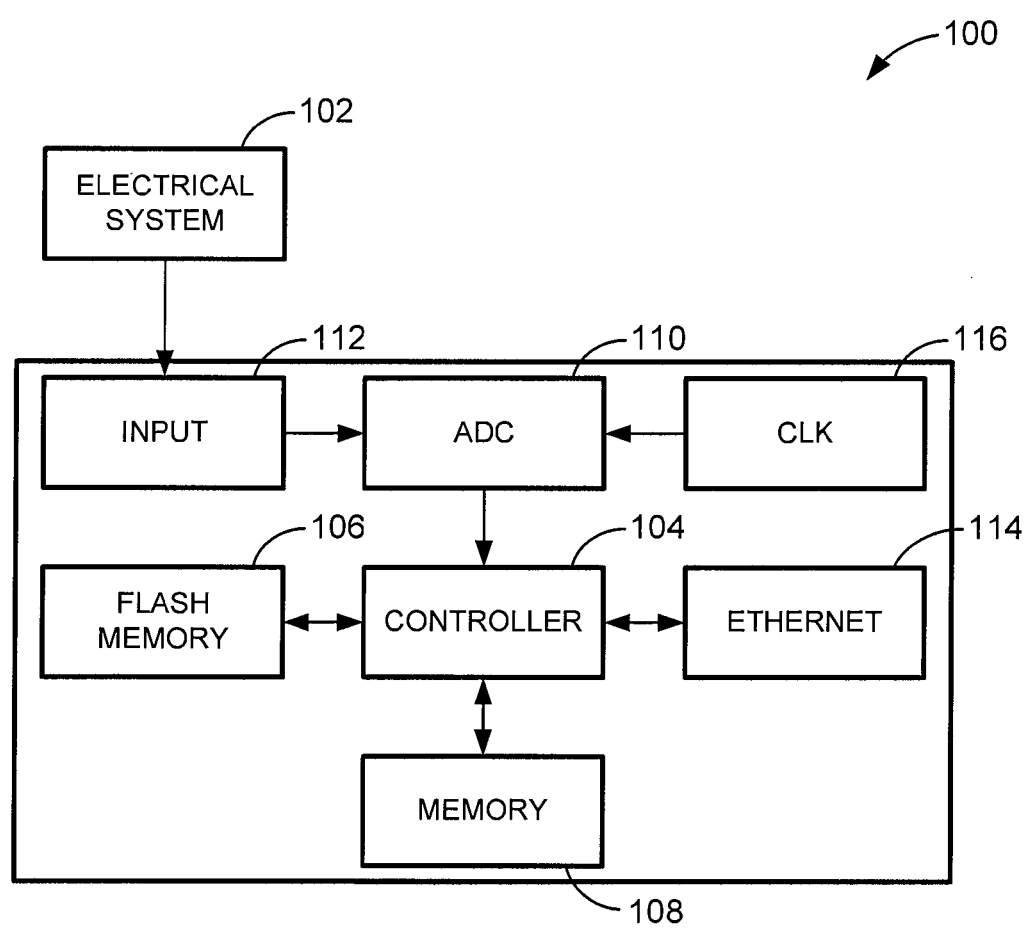
FIG. 1 is a functional block diagram of a monitoring device using a fixed clock analog to digital converter.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 shows a monitoring device 100 which is a meter used to measure electrical characteristics in an electrical system 102. In this example, the monitoring device 100 may be a power meter or a circuit monitor. The electrical system 102 in this example is a utility system being monitored by the monitoring device 100 may be any of the five utilities designated by the acronym, WAGES, or water, air, gas, electricity, or steam in this example. The measured characteristics, which may include current, voltage, frequency, power, energy, volume per minute, volume, temperature, pressure, flow rate, or other characteristics of water, air, gas, electricity, or steam utilities, are recorded as output data relating to such measurements. The device 100 may be capable of storing data in onboard memory and is capable of communicating with a data collection system via a network to transmit measured characteristics to the data collection system for display, storage, reporting, alarming, and other functions.

The monitoring device 100 measures characteristics of the utility, and quantifies these characteristics into data that can be further analyzed by software. In the electrical context, the monitoring device 100 may be a PowerLogic® Series 3000/4000 Circuit Monitor or a PowerLogic® ION7550/7650 Power and Energy Meter, or PMS 5000 series meter available from Schneider Electric or any other suitable monitoring device such as an intelligent electronic device (IED), a metering device, or a power meter.

The monitoring device 100 includes a controller 104, a flash memory 106, a DRAM memory 108, an analog to digital converter 110, an input port 112, an Ethernet interface 114, and a clock 116. The Ethernet interface 114 has one or more on-board Ethernet ports, e.g., one for a 10/100Base TX Twisted Pair connection and another for a 100Base Fx connection. The Ethernet interface 114 may be coupled to a network for transmission of measured data from the monitoring device 100. Similarly, data from the monitoring points of a system such as an electrical system 102 in FIG. 1 may be coupled to a line coupled to the input port 112.

The controller 104 in FIG. 1 collects, stores, and distributes data (i.e., indicative of the utility characteristics such as current or voltage) recorded by the monitoring device 100 from the input port 112. Different operating instructions are burned into the flash memory 106 to operate the controller 104. The collected data derived from the electrical output signal, such as measured current or voltage values, may be stored as samples in buffers and registers in the memory 108.

The analog to digital converter (ADC) 110 converts the sampled output signal measured from a power signal from the analog domain to the digital domain, i.e., a signal represented by continuous quantities such as current or voltage is converted to samples represented by a sequence of numbers. In this example the analog to digital converter 110 is an internal analog to digital converter on an STM 32 controller. Thus, the A/D converter 110 supplies the controller 104 with a series of original samples OS(1), OS(2), OS(3) ... OS(m), at a known sampling frequency (rate) fs. In order to process the samples in relation to the output signal, the frequency of the input signal must be determined by the monitoring device 100.

It is therefore desirable to have a reasonably accurate frequency measurement method in the monitoring device 100 (some standards require accuracy on the order of 10 milli-hz) in FIG. 1 for signal analysis. For example, in cases where the measured frequency is also used to control the sample rate of the analog to digital converter 110 in order to implement synchronous sampling, as in a metering device, an accurate and stable frequency measurement is required.

For further processing, the frequency of the power signal is determined by the controller 104 using a modified version of the "Devaney" algorithm. In order to calculate the frequency, the present modified algorithm obtains four points of interest from a specific waveform and a point of interest from the previous cycle to calculate the frequency of the waveform. These points of interest are equally spaced by 90° or a quarter cycle. For example, the points of interest from the current cycle may be taken at the 0°, 90°, 180°, and 270° phases of a complete waveform and the point of interest of the previous cycle's 270° phase for a total of five points for the calculation of the frequency. The Devaney algorithm is further explained in "A New Quadratic Form Based Frequency Measurement Algorithm" IEEE Instrumentation and Measurement Technology Conference, Jun. 4-6, 1996, hereby incorporated by reference. The Devaney algorithm determines the frequency of a measured signal using quadratic forms of sampled signals and does not require a fixed sampling frequency.

The present algorithm applies a simple averaging filter to multiple data points measured from the signal to derive each of the four points of interest for the current cycle for determining the frequency. By filtering harmonic content from the algorithm, a better input signal is provided than is actually applied to the "Devaney" algorithm. The modified algorithm also maintains the same DC bias for each cycle. By maintaining the same DC bias of each cycle, the modified algorithm will synchronize faster and be more accurate. The output of the modified algorithm also includes a correction factor to the prior frequency reported. Once the deviation of consecutively reported frequencies is below certain percentages, reducing the correction factor helps stabilize the reported cycle by cycle frequency.

Thus, the averaging of multiple data points from the cycle around the point of interest is performed by the controller 104 to obtain each of the four points of interest of the current cycle required to determine the frequency of the signal. For example, assuming 32 samples per cycle, the 8 data points taken from the waveform closest to the point of interest of the current cycle would be averaged to obtain the value of that point.

In order to compensate for DC bias, the DC bias factor from the previous cycle is added to the point of interest taken from the previous cycle. The DC bias factor is determined by calculating the mean of the current cycle's set of four points of interest. The DC bias factor is subtracted from each of the four points from the current cycle and the point from the previous cycle to improve tacking and normalization of the samples.

The frequency of the current cycle is compared with the frequency of the previous cycle. This difference is added to one and multiplied by the frequency of the previous cycle to obtain the sample rate of the next cycle to maintain a synchronous cycle. If the difference is less than a predetermined value (e.g., 4%), then the cycles are considered synchronous, then the difference is reduced by a given factor such as 20-50% for more stable cycle to cycle stabilization. Thus the controller 104 running the averaging algorithm results in improved harmonic filtering, faster frequency synchronization and more stable cycle by cycle frequency measurements.

The frequency of the signal is determined using the following equation for a Devaney algorithm.

$$f_{n+1} = f_n \times \left(1 + \frac{x_n x_{n-3} - x_{n-1} x_{n-2}}{\pi\left(\left(\frac{x_{n-4}}{24} - x_{n-2}\right)x_n + x_{n-1}^2 - \frac{x_{n-2}^2}{24}\right)}\right)$$

In this equation, $f_{n+1}$ is the determined frequency of the current cycle, $f_n$ is the frequency of the previous cycle and $x_n$ to $x_{n-4}$ are data points of interest of the current and previous cycle. In this equation, the $x_n$ is the last point of interest in the current cycle while $x_{n-4}$ is the point of interest from the previous cycle. In the above equation, the ratio of the points of interest is a form of correction factor to the last cycle's frequency. The "1+" centers the correction around 100% to be used as a modifier to the previous cycle's frequency.

The following source code represents an example of the modified algorithm executed by the controller 104 in FIG. 1 using 32 samples per cycle to determine the frequency of the current or voltage signal being monitored.

The corrected frequency is limited to between 20 and 90 Hz, and these values are arbitrarily chosen for this example, but may be more precisely selected for higher frequency and processor utilization. The X percent is the correction factor per cycle, which is currently allowed to be more than the ±0.01 Hz in this example. In this example, the value of 4% (0.04) is used to consider five consecutive frequencies from cycle to cycle as synched. The modified algorithm includes a check that if the correction ratio is less than X percent, the correction factor is set reduced to MET_FREQ_SYNC_STABLIZER (90%). This reduces the cycle by cycle fluctuation.

The averaging of the sampled data points to determine the points of interest enable accurate measurement of the frequency of some non-sinusoidal signals. With one system, the modified algorithm is capable of detecting the frequency of an applied sign, square and triangle wave above certain values peak to peak. In this example, six points are averaged to maintain frequency lock and measure the frequency.

The DC offset is removed for each cycle thereby improving the algorithm results. The DC offset is removed for the 4 data points of interest $x_n$ to $x_{n-3}$, while adding the previous offset to the data point $x_{n-4}$, and subtracting the current offset from the data points, $x_{n-4}$.

In this example, the time to give a particular channel to lock is currently set to 30 cycles which can vary greatly in the amount of time depending on the present algorithm's corrected frequency. The limits of the frequencies in this example range from 20 to 90 Hz from one cycle to the next.

The controller 104 in FIG. 1 may be conveniently implemented using one or more general purpose computer systems, microprocessors, digital signal processors, micro-controllers, application specific integrated circuits (ASIC), programmable logic devices (PLD), field programmable logic devices (FPLD), field programmable gate arrays (FPGA) and the like, programmed according to the teachings as described and illustrated herein, as will be appreciated by those skilled in the computer, software and networking arts.

In addition, two or more computing systems or devices may be substituted for any one of the controllers described herein. Accordingly, principles and advantages of distributed processing, such as redundancy, replication, and the like, also can be implemented, as desired, to increase the robustness and performance of controllers described herein. The controllers may also be implemented on a computer system or systems that extend across any network environment using any suitable interface mechanisms and communications technologies including, for example telecommunications in any suitable form (e.g., voice, modem, and the like), Public Switched Telephone Network (PSTNs), Packet Data Networks (PDNs), the Internet, intranets, a combination thereof, and the like.

The operation of the example frequency determination algorithm will now be described with reference to FIG. 1 in conjunction with the flow diagram shown in FIG. 2. The flow diagram in FIG. 2 is representative of example machine readable instructions for determining sample points for determining the frequency of a waveform. In this example, the machine readable instructions comprise an algorithm for execution by: (a) a processor, (b) a controller, and/or (c) one or more other suitable processing device(s). The algorithm may be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the determining sample points for determining the frequency of a waveform sequence could be implemented by software, hardware, and/or firmware. Also, some or all of the machine readable instructions represented by the flowchart of FIG. 2 may be implemented manually. Further, although the example algorithm is described with reference to the flowchart illustrated in FIG. 2, persons of ordinary skill in the art will readily appreciate that many other methods of implementing the example machine readable instructions may alternatively be used. For example, the order of execution of the blocks may be changed, and/or some of the blocks described may be changed, eliminated, or combined.

In FIG. 2, the controller 104 begins a sampling process of an input waveform, such as a waveform representing a current or voltage measured by the monitoring device 100 (200). The sampling includes determining at least four points of interest or values of the measured current or voltage at different points of the waveform in a complete cycle. After completion of sampling of the data points in one waveform cycle (202), the controller 104 averages points of interest from the sampled data points to determine the four points of interest which are spaced by 90 degrees (¼ cycle) in the waveform cycle (204). The controller 104 fetches the last data point of interest value from the previous waveform (206). The controller 104 calculates the DC bias factor based on the average value of all of the points of interest of the current waveform (208). The controller 104 performs a DC bias calculation on the determined data points of interest by adding the DC bias factor of the previous cycle to the last data point of interest of the previous cycle. The DC bias factor of the current cycle is determined by calculating the mean of the four points of interest and then subtracting the DC bias factor from the four points of interest of the current cycle and the last point of interest of the previous cycle to compensate for the DC bias (210). The modified points of interest are then fed into an algorithm to determine the frequency of the waveform (212). The resulting frequency determined by the frequency algorithm is error corrected by comparing the frequency of the previous cycle with the frequency of the current cycle to determine the error factor (214). The error factor is compared with a threshold value (216). If the error factor is less than the threshold value, the error factor is reduced (218). The sample rate is determined by adding the error factor to one and multiplying by the frequency of the previous cycle to maintain a synchronous cycle (220). The controller 104 does not reduce the error factor if the difference is above or equal to a certain threshold value. The determined frequency is stored (222) for later applications such as determining other measurements from the waveform.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of calculating a frequency of a waveform having periodic cycles including a current cycle and a previous cycle, each cycle having four equally spaced phase angles, the waveform measured from a monitoring device, the method comprising:
   measuring a plurality of data points from a current cycle of the waveform via the monitoring device;
   referencing a last point of interest from the previous cycle of the waveform via a controller;
   determining four points of interest at equally spaced phase angles from the current cycle of the waveform by selecting a subset of the plurality of data points around each of the equally spaced phase angles and calculating the average of the subset of data points around each of the respective equally spaced phase angles of the current cycle of the waveform via the controller;
   subtracting the average value of the points of interest in the current cycle from the four points of interest and the last point of interest from the previous cycle to compensate for DC bias; and
   determining a frequency of the waveform based on the determined four points of interest of the current cycle and the last point of interest from the previous cycle.

2. The method of claim 1, further comprising determining a sample frequency for the next cycle by multiplying the previous frequency by one plus a correction factor, the correction factor being the difference between the frequency of the current cycle and the previous cycle, and wherein the correction factor is compared to a threshold value, and the correction factor for the next cycle is reduced if the correction factor is below the threshold value.

3. The method of claim 2, wherein the threshold value is dependent on the frequency shift of the current cycle.

4. The method of claim 1, wherein the frequency is determined according to:

$$f_{n+1} = f_n \times \left(1 + \frac{x_n x_{n-3} - x_{n-1} x_{n-2}}{\pi\left(\left(\frac{x_{n-4}}{24} - x_{n-2}\right)x_n + x_{n-1}^2 - \frac{x_{n-2}^2}{24}\right)}\right)$$

Wherein $f_{n+1}$ is the frequency of the current cycle, $f_n$ is the frequency of the previous cycle and $x_n$ to $x_{n-4}$ are points of interest of the current and previous cycle.

5. A monitoring device for measuring the frequency of a waveform having a plurality of cycles including a current cycle and a previous cycle, each cycle having four equally spaced phase angles, the monitoring device comprising:
   an input coupled to the waveform;
   an analog to digital converter coupled to the input, the analog to digital converter measuring a plurality of data points from a current cycle of the waveform;
   a memory storing a point of interest from a previous cycle of the waveform; and
   a controller coupled to the analog to digital converter, the controller:
      referencing a point of interest from the previous cycle;
      determining four points of interest at equally spaced phase angles from the current cycle of the waveform by selecting a subset of the plurality of data points around each of the equally spaced phase angles and calculating the average of the subset of data points around each of the respective equally spaced phase angles of the current cycle of the waveform;
      subtracting the average value of the points of interest in the current cycle from the four points of interest and the last point of interest from the previous cycle to compensate for DC bias; and
      determining a frequency of the waveform based on the determined four points of interest of the current cycle and the last point of interest from the previous cycle.

6. The device of claim 5, wherein controller determines a sample frequency for the next cycle by multiplying the previous frequency by one plus a correction factor, the correction factor being the difference between the frequency of the current cycle and the previous cycle, and wherein the correction factor is compared to a threshold value, and the correction factor for the next cycle is reduced if the correction factor is below the threshold value.

7. The device of claim 6, wherein the threshold value is dependent on the frequency shift of the cycle.

8. The device of claim 5, wherein the frequency is determined according to:

$$f_{n+1} = f_n \times \left(1 + \frac{x_n x_{n-3} - x_{n-1} x_{n-2}}{\pi\left(\left(\frac{x_{n-4}}{24} - x_{n-2}\right)x_n + x_{n-1}^2 - \frac{x_{n-2}^2}{24}\right)}\right)$$

wherein $f_{n+1}$ is the frequency of the current cycle, $f_n$ is the frequency of the previous cycle and $x_n$ to $x_{n-4}$ are points of interest of the current and previous cycle.

9. A non-transitory machine readable medium having stored thereon instructions for determining the frequency of a waveform having periodic cycles including a current cycle and a previous cycle, each cycle having four equally spaced phase angles, the stored instructions comprising machine executable code, which when executed by at least one machine processor, causes the machine to:
   measure a plurality of data points from a current cycle of the waveform;
   reference a last point of interest from the previous cycle of the waveform;
   determine four points of interest at equally spaced phase angles from the current cycle of the waveform by selecting a subset of the plurality of data points around each of the equally spaced phase angles and calculating the average of the subset of data points around each of the respective equally spaced phase angles of the current cycle of the waveform;

subtract the average value of the points of interest in the current cycle from the four points of interest and the last point of interest from the previous cycle to compensate for DC bias; and determine a frequency of the waveform based on the determined four points of interest of the current cycle and the last point of interest from the previous cycle.

10. The machine readable medium of claim 9, wherein the instructions which when executed by at least one machine processor, further cause the machine to determine a sample frequency for the next cycle by multiplying the previous frequency by one plus a correction factor, the correction factor being the difference between the frequency of the current cycle and the previous cycle, and wherein the correction factor is compared to a threshold value, and the correction factor for the next cycle is reduced if the correction factor is below the threshold value.

11. The machine readable medium of claim 10, wherein the threshold value is dependent on the frequency shift of the current cycle.

12. The machine readable medium of claim 9, wherein the frequency is determined according to:

$$f_{n+1} = f_n \times \left(1 + \frac{x_n x_{n-3} - x_{n-1} x_{n-2}}{\pi\left(\left(\frac{x_{n-4}}{24} - x_{n-2}\right)x_n + x_{n-1}^2 - \frac{x_{n-2}^2}{24}\right)}\right)$$

Wherein $f_{n+1}$ is the frequency of the current cycle, $f_n$ the frequency of the previous cycle and $x_n$ to $x_{n-4}$ are points of interest of the current and previous cycle.

13. A method of calculating a frequency of a waveform having periodic cycles including a current cycle and a previous cycle, each cycle having four equally spaced phase angles, the waveform measured from a monitoring device, the method comprising:

measuring a plurality of data points from a current cycle of the waveform via the monitoring device;

referencing a last point of interest from the previous cycle of the waveform via a controller;

determining four points of interest at equally spaced phase angles from the current cycle of the waveform by selecting a subset of the plurality of data points around each of the equally spaced phase angles and calculating the average of the subset of data points around each of the respective equally spaced phase angles of the current cycle of the waveform via the controller;

subtracting the average value of the points of interest in the current cycle from the four points of interest and the last point of interest from the previous cycle to compensate for DC bias;

determining a frequency of the waveform based on the determined four points of interest of the current cycle and the last point of interest from the previous cycle; and determining a sample frequency for the next cycle by multiplying the previous frequency by one plus a correction factor, the correction factor being the difference between the frequency of the current cycle and the previous cycle, and wherein the correction factor is compared to a threshold value, and the correction factor for the next cycle is reduced if the correction factor is below the threshold value.

* * * * *